United States Patent [19]

Brightman et al.

[11] 4,437,096

[45] Mar. 13, 1984

[54] CONCENTRATOR CIRCUIT INCORPORATING SOLID STATE BILATERAL BRIDGE ARRANGEMENT

[75] Inventors: Barrie Brightman; Frank Niertit, both of Casselberry, Fla.

[73] Assignee: Stromberg-Carlson Corp., Tampa, Fla.

[21] Appl. No.: 335,593

[22] Filed: Dec. 30, 1981

[51] Int. Cl.³ .................. H03K 17/00; H04Q 3/52
[52] U.S. Cl. .................. 340/825.96; 179/18 GF; 179/18 FC; 307/257
[58] Field of Search ........ 179/18 GF, 18 FA, 18 FC; 370/56; 340/825.96; 307/257, 115

[56] References Cited

U.S. PATENT DOCUMENTS

| | | | |
|---|---|---|---|
| 2,866,103 | 12/1958 | Blake et al. | 307/257 |
| 3,098,214 | 7/1963 | Windes et al. | 307/257 X |
| 3,737,680 | 6/1973 | Uchida | 307/257 |
| 3,796,894 | 3/1974 | Marchetti et al. | 307/257 |
| 3,973,143 | 8/1976 | Embree et al. | 307/255 |

OTHER PUBLICATIONS

"High Voltage Crosspoint Device for Line Concentrator Mounted on the Ceramic Board with Crossover Capacitance", Yoshino et al., International Switching Symposium (Paris), May 7-11, 1979, pp. 660-666.

"Electronic Replacements for Relays", A. W. Sweet, *Electrical Communication*, vol. 54, No. 1, 1979, pp. 51-55.

*Primary Examiner*—Thomas W. Brown
*Attorney, Agent, or Firm*—Cesari and McKenna

[57] ABSTRACT

A bilateral, low loss, wide band, concentrator circuit selectively controls the transfer of a signal between one of a plurality of first terminals and a single, second terminal. The balance points of each of a plurality of bilateral current gates connect to one of the first terminals and to the second terminal. A floating power supply and selection switches selectively forward bias one of the bilateral current gates so it operates as a modulator in which the signal to be switched is modulated onto the bias current thereby to form a low-loss, wide-band path between the selected first terminal and the second terminal.

6 Claims, 5 Drawing Figures

CONCENTRATOR CIRCUIT INCORPORATING SOLID STATE BILATERAL BRIDGE ARRANGEMENT

RERFERENCE TO RELATED APPLICATIONS

U.S. patent application Ser. No. 06/335,648, titled "All Electronic Interface for Telephony System", by Barrie Brightman and Frank Niertit and filed on an even date with this application.

BACKGROUND OF THE INVENTION

This invention generally relates to concentrator circuits, and more specifically to wide band, low loss, low distortion electronic concentrator circuits.

Telephone switching networks incorporate a wide variety of electrical switching elements in diverse applications. One such application is a front end concentrator. A front end concentrator connects to a plurality of telephone lines and selectively connects one of those telephone lines to a common line or signal path, such as a shared line circuit, under the control of selection signals. When a selection is made, signals pass from the selected telephone line to the common signal path and from the common signal path to the selected telephone line as if the common signal path were dedicated to the telephone line.

The switching elements that constitute the concentrator must comprise bilateral, wide band, low loss, low distortion switching elements. Conventionally, these switching elements comprise electromechanical relays and related circuits. When the contacts on a relay close, the resulting metal-to-metal connection forms a conductive path that produces essentially no loss of, and no distortion to, any signal passing through the contacts. The connection allows bilateral signal transmission over a wide range of frequencies. The contacts can withstand voltage and current levels that are dependent only on the rating of the contacts themselves. These relays also provide lightning and other transient signal protection to control circuits because the air gap between the contacts and the coil inherently isolates transient signals on the conductive path from the control circuitry that connects to the coil.

Unfortunately, such electromechanical devices have a number of known characteristics that are detrimental in many applications including telephony concentrator applications. Life expectancy of a relay depends upon contact wear. As contact wear is not predictable on an accurate basis, it is difficult to predict relay life. Moreover, electromechanical relays tend to be expensive, and this expense is subject to high cost multiples in concentrators for telephone switching networks where one such relay can be used for each of the many telephone lines connected to a single concentrator and where the telephone switching network may include many concentrators. Electromechanical relays also increase other manufacturing costs as they are discrete elements and must be mounted on circuit boards individually.

Special switching circuits have been proprosed from time to time to replace the electromechanical relay. Reversely poled, silicon-controlled rectifier and other transistor circuits have been suggested. However, in telephone concentrator applications both dc hook signals and analog voice signals pass through such a switching circuit and the reversely poled transistor and SCR circuits introduce a crossover distortion as these circuits tend to stop conducting near the zero voltage, or current crossover, point. Circuitry can be added to compensate for such distortion. However, this and other circuitry that may be necessary to provide proper operation, increase the overall costs of manufacture for the concentrator.

More recently, a gated diode switch has been proposed that can be manufactured with large scale integration manufacturing techniques. The large number of switches in concentrators makes the use of large scale integration manufacturing techniques highly desirable, especially in view of the attendant cost savings that can be achieved. The proposed switch, however, has certain disadvantages. First, this circuit requires high voltage differences in the order of up to 600 volts. When the switch is located in the standard tip and ring conductors to or from a subscriber's handset, certain precautions must be taken to protect customers and telephone company personnel against inadvertent contact with these voltages. This switching circuit also requires three separate voltages and this, of course, introduces complexities in the power supplies that serve the telephone switching network. Moreover, it would appear from available information that the proposed switch may require compensation for crossover distortion when the switching circuit conveys analog voice signals.

SUMMARY

Therefore, it is an object of this invention to provide a concentrator of an improved design that is free of electromechanical relays.

Yet another object of this invention is to provide an improved concentrator that is adapted for use in telephone switching networks.

Still another object of this invention is to provide an improved concentrator that can be manufactured by large scale integration manufacturing techniques.

Still yet another object of this invention is to provide an improved concentrator that introduces substantially no distortion into a signal passing through the concentrator.

Yet still another object of this invention is to provide an improved concentrator that is capable of switching signals of reasonably high voltage and current levels.

Still yet another object of this invention is to provide an improved concentrator that isolates a signal being switched from a control circuit.

An improved concentrator constructed in accordance with this invention includes a switching circuit that conveys signals between first and second terminals. The switching circuit comprises a bilateral current gate circuit that includes a plurality of diodes, input and output junctions that define parallel, unidirectional, current paths including the diodes, and balance point junctions that connect to the first and second terminals. A controllably switched, floating bias circuit, when energized, forward biases switching circuitry that couples a bias current through the input and output junctions, thereby to forward bias said diodes and enable the transfer of signals between said first and second terminals through the diodes.

This invention is pointed out with particularity in the appended claims. The above and further objects and advantages of this invention may be better understood by referring to the following description taken in conjunction with the accompanying drawings.

DESCRIPTION OF AN ILLUSTRATIVE EMBODIMENT

Figure 1:
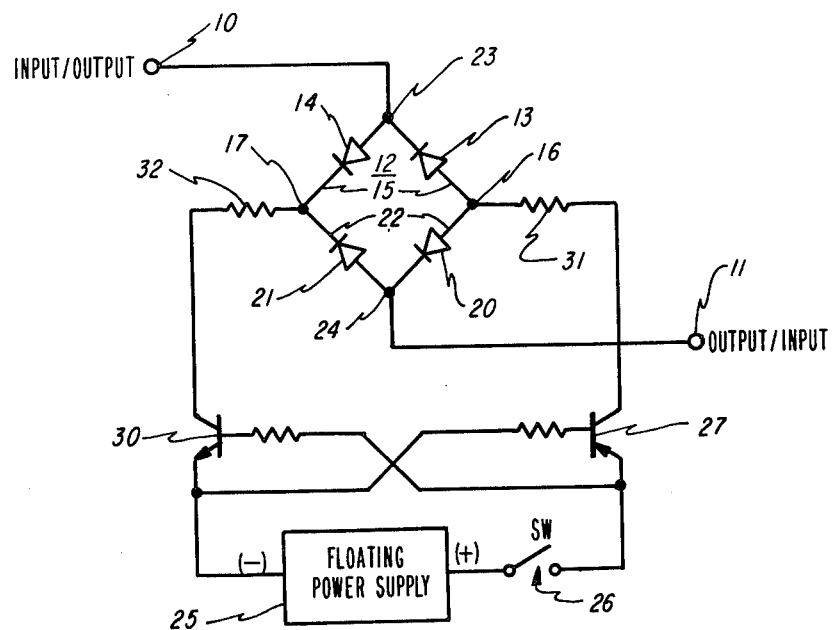
FIG. 1 is a circuit diagram of one embodiment of a switching circuit constructed in accordance with this invention and that is adapted for use in a concentrator.

Referring to FIG. 1, the switching circuit interconnects a first terminal 10 and a second terminal 11 that are adapted to carry a DC or AC signal having a predetermined range of current and voltage ratings. Terminal 10 is designated an "input/output" terminal while terminal 11 is denoted an "output/input" terminal, to designate the bilateral nature of the switching circuit. That is, if an input signal is applied to terminal 10, terminal 11 is an output terminal. If an input signal is applied to terminal 11 it is an input terminal while terminal 10 is an output terminal.

These signals pass through a bilateral current gate 12 that includes a plurality of diodes. Diodes 13 and 14 connect in series and define a unidirectional current path 15 for conducting a bias current, in conventional terms, from a first, or input, junction 16 to a second junction 17. A second current path 22 that is in parallel with the current path 15 also conducts a bias current from the first junction 16 to the second junction 17.

A third junction 23, formed by the cathode of diode 13 and the anode of diode 14, connects to the input/output terminal 10, while a fourth junction 24, formed by cathode of the diode 20 and the anode of the diode 21, connects to output/input terminal 11. Third and fourth junctions 23 and 24 are at the balance points on the bilateral current gate 12 and are called balance point junctions.

In the bilateral current gate 12, the reverse breakdown voltage ratings for the diodes exceed the voltages normally produced by lightning and other transients. Thus, the bilateral current gate 12 inherently is not adversely affected by such transients as they appear at the terminals 10 and 11.

It will now be apparent that the bilateral current gate 12 operates as a switch between the balance point junctions 23 and 24 that is turned on and off by a bias current. So long as the bias current exceeds the peak AC current of the signal from the terminals 10 and 11, the bilateral current gate 12 will operate as a low-distortion, low-loss, switch that closely approximates the signal transfer characteristics through a set of relay contacts.

The bias current that controls the switching characteristics of the bilateral current gate 12 is supplied from a controllably switchable, floating bias circuit that comprises a floating power supply 25 and a switch, shown as a simple switch 26 in representative form. When the switch 26 closes, the floating power supply 25 biases an NPN transistor 27 and a PNP transistor 30 into conduction. A DC path is then established through the switch 26, the transistor 27, a limiting resistor 31, the bilateral current gate 12, another limiting resistor 32, and the transistor 30. Thus, AC signals having a peak current less than the bias current pass between the input/output terminal 10 and the output/input terminal 11 through the diodes of the bilateral current gate 12 without significant alternation or distortion.

When the switch 26 opens, there is no path for the signal between the terminals 10 and 11. Specifically, when the terminal 10 is more positive than the terminal 11, the diodes 13 and 21 are blocking and the only other path through the power supply 25 is blocked by the open switch 26 and the transistors 27 and 30 that are not conducting. Similarly, when the terminal 11 is more positive than the terminal 10, diodes 14 and 20 block, while the only other path through the power supply 25 is also blocked.

Thus, the circuit shown in FIG. 1 can be considered as a modulator that is characterized by a DC carrier current and that can only convey a signal between the terminals 10 and 11 when the floating power supply 25 produces the carrier current. As a result, there is no signal loss through the bilateral current gate 12. The switch eliminates the need for electromechanical relays and the problems inherent in those relays. Moreover, in accordance with the particular objects of this invention, there is substantially no distortion introduced to a signal between the terminals 10 and 11. Even with conventional components, the switch can withstand reasonably high voltage and current levels. The bilateral current gate is constructed either of discrete components or with large-scale, integrated circuit technology.

Figure 2:
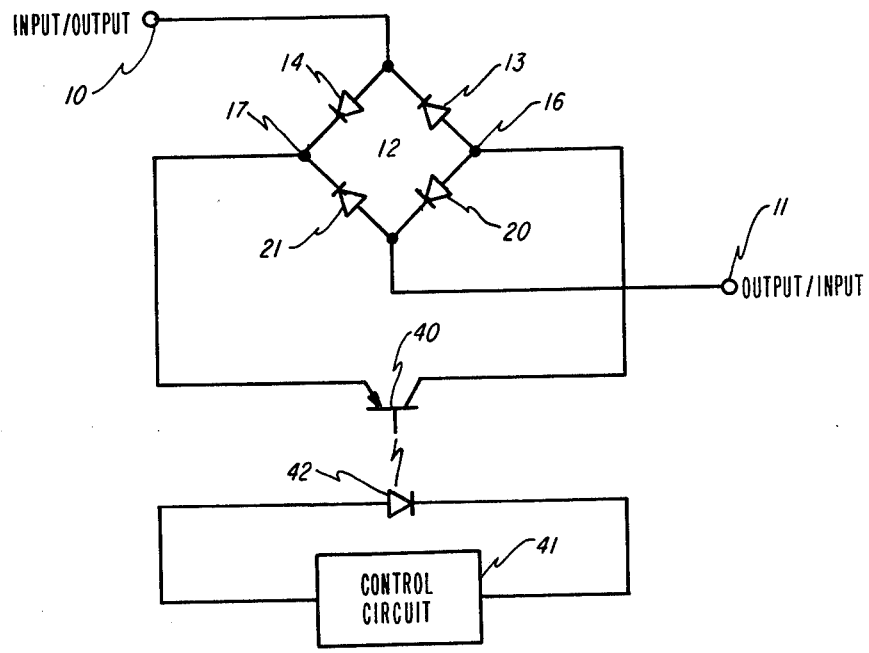
FIG. 2 is a circuit diagram of another embodiment of a switching circuit constructed in accordance with this invention and that is adapted for use in a concentrator.

FIG. 2 depicts another embodiment of a switching circuit for conveying signals between terminals 10 and 11. In FIG. 2 like reference numerals refer to like elements in FIG. 1. This switch includes a bilateral current gate 12 including diodes 13 and 14 and 20 and 21. A light activated transistor 40 connects between the common junctions 16 and 17 to complete a DC path. A control circuit 41 and light-emitting diode 42 constitute a controllably switchable, floating bias circuit. When the control circuit 41 energizes the diode 42, the transistor 40 conducts and establishes a DC path depending upon the relative polarities of the terminals 10 and 11. When the terminal 10 is more positive, the current path includes the diode 14, the transistor 40, and the diode 20. When the terminal 11 is more positive, the DC path includes the diode 21, the switch 40, and the diode 13.

When the control circuit 41 does not energize the diode 42, the transistor 40 is nonconducting. In this condition, signals driving the terminal 10 positive with respect to the terminal 11 are blocked by diodes 13 and 21 and by the nonconducting transistor 40. When the terminal 11 is positive with respect to the terminal 10, diodes 14 and 20, as well as the transistor 40, are in a blocking mode.

In this embodiment, the diodes and transistor 40 will cease conducting as the potential difference approaches zero. This produces some crossover distortion in an AC signal. However, in applications where an AC signal is not being controlled or such distortion is acceptable, this circuit will constitute a less costly alternative to the circuit shown in FIG. 1.

Figure 3:
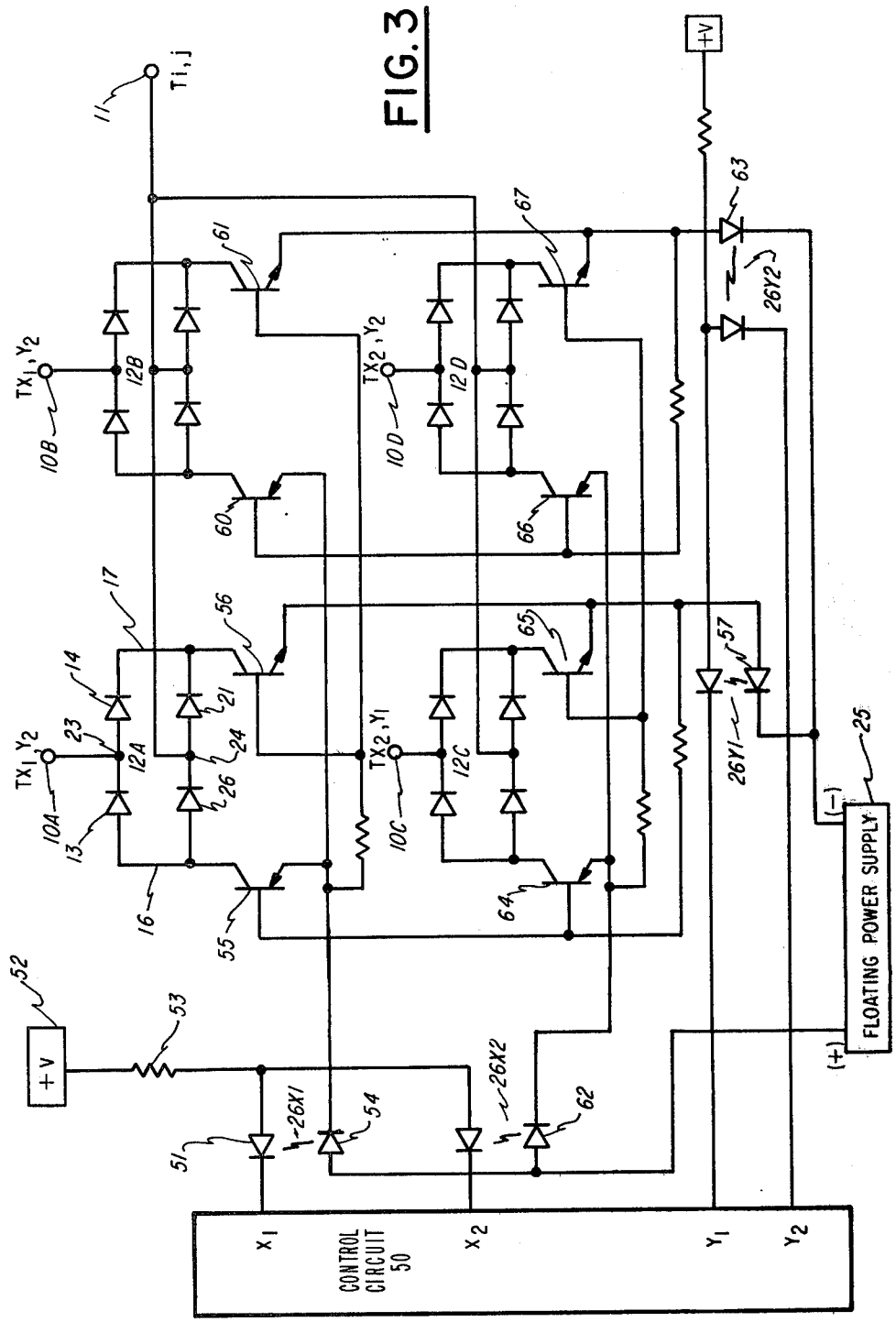
FIG. 3 is a circuit diagram of one embodiment of a concentrator circuit constructed in accordance with this invention.

FIG. 3 depicts a group of switches such as those shown in FIG. 1 arranged in a concentrator configuration. The concentrator in FIG. 3 selectively couples one of many terminals to a common terminal. In this particular embodiment, a two-by-two matrix is defined by rows x1 and x2 and by columns y1 and y2. The bilateral gates are designated 12A through 12D. The bilateral gate 12A further contains the reference numerals that are used in FIG. 1 as the bilateral current gate is shown in a slightly different schematic form in FIG. 3, but it will be apparent that the actual connections are the same.

Each of the input terminals 10A through 10D is designated by its coordinates on the matrix; that is, terminal 10A receives the signal Tx1,y1 whereas terminal 10C receives a signal designated Tx2,y1. The terminal 11 then corresponds to a signal Ti,j where i can be any of the numbers x1, x2 . . . and j can be any of the numbers y1, y2 . . . .

The selection of a particular bilateral current gate in the matrix is established by selection control circuitry including a control circuit 50 that generates row signals x1 and x2 and column signals y1 and y2. In this particular embodiment, these are ground assertion signals; that is, the signal is considered to be logically true, or on, when the voltage goes to a ground level. These signals control the activation of switches in the selection circuitry that correspond to the switch 26 in FIG. 1 and are designated as switches 26X1, 26X2, 26Y1, and 26Y2 in FIG. 3.

Referring to switch 26X1 as an example, the assertion of the x1 signal grounds the cathode of a diode 51 and establishes a DC path from a voltage power supply 52 through a resistor 53. The diode 51 is a light-emitting diode and causes light to be coupled to a light-sensitive diode 54 with its anode connected to the positive output of the floating power supply 25. When one of the row and one column switch are energized, one of the bilateral current gates is selected and turned on. For example, assume that the control circuit 50 asserts the x1 and y1 signals, thereby turning on switches 26X1 and 26Y1. The resulting DC current path includes the diode 54, a switching circuit including the base-collector circuit of a transistor 55 that is turned on when the switch 26Y1 conducts, the diodes in the bilateral current gate 12A, another switching circuit including the base-collector circuit of an NPN transistor 56 that is biased into conduction when the switch 26X1 closes, and a diode 57 in the switch 26Y1.

None of the other diode gate circuits can conduct. Referring specifically to the bilateral current gate 12B, with the floating power supply 25 energizing potential being passed through the diode 54, the base-emitter junction of transistors 60 and 61 is biased for conduction. However, the open state of the switch 26Y2 inhibits conduction of those transistors. Similarly, the non-conducting state of the diodes 62 and 63 prevents conduction of transistors 64 and 65 associated with the bilateral current gate 12C and transistors 66 and 67 associated with the bilateral current gate 12D.

If the control circuit 50 energizes the x2 and y1 outputs, the switches 26X2 and 26Y1 are closed. The resulting DC current path includes the diode 62, the transistor 64, the bilateral current gate 12C, the transistor 65, and the diode 57. The remaining bilateral current gates, 12A, 12B and 12D, cannot conduct because the bias current paths are interrupted.

The control circuit 50 therefore selects one of the signals Tx1,y1 through Tx2,y2 for coupling to the common terminal 11. As was true with the circuit in FIG. 1, transient signals have no adverse effect on the bilateral current gates. Moreover, the control circuit 50 is isolated through the optoelectronic switches; for example, switch 26X1. With the proper selection of bias current, the selected current gate introduces no distortion and can accept the relatively high voltage and current ratings that are associated with many applications, particularly in the switching of tip and ring conductors in a telephone line.

Figure 4:
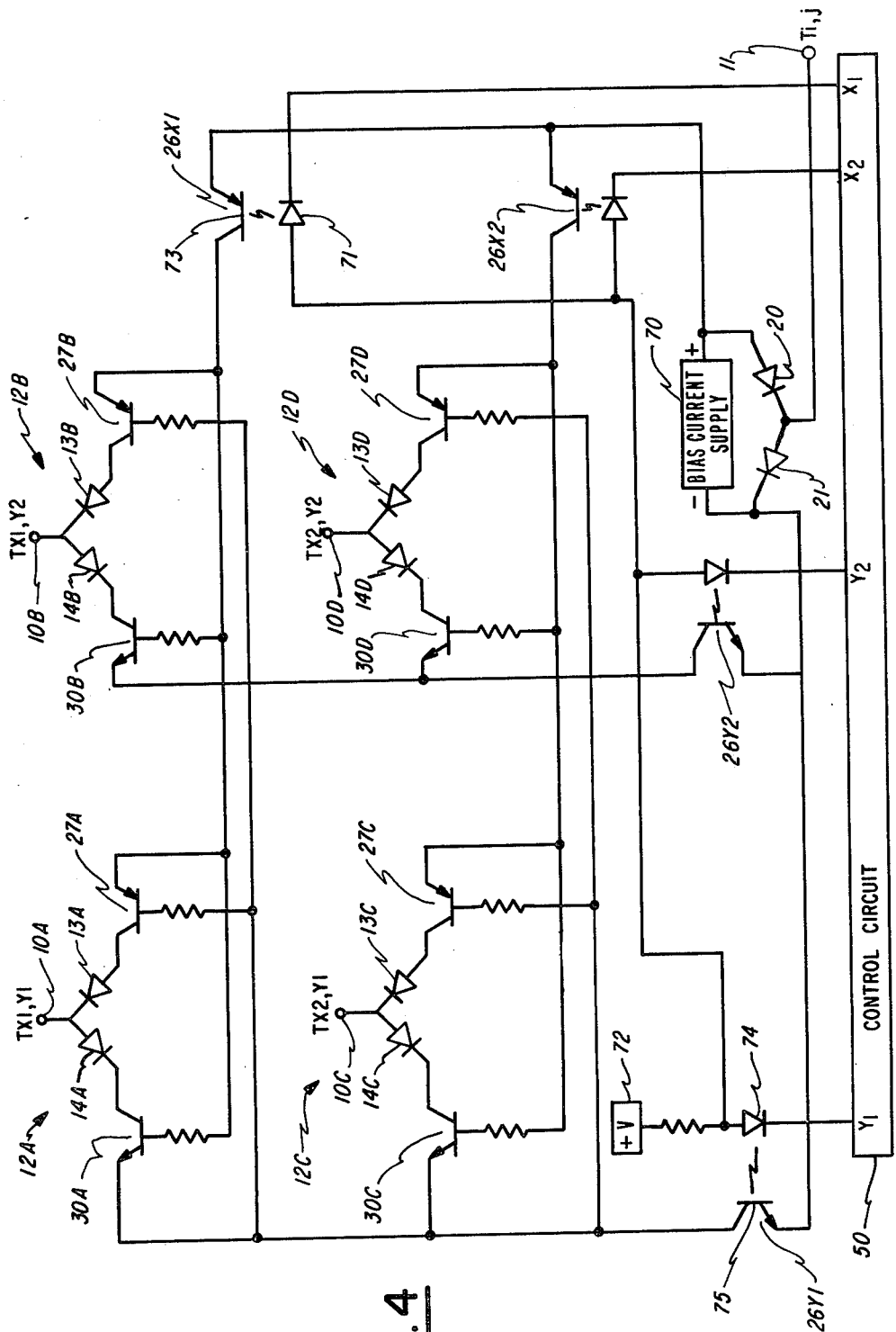
FIG. 4 is a circuit diagram of another embodiment of a concentrator circuit constructed in accordance with this invention.

A less costly alternative embodiment of a concentrator is shown in FIG. 4. This circuitry is particularly adapted to applications in which the signals being switched do not need to be distortion free. In this particular application, the bilateral current gate of FIG. 1 is split into an upper and a lower half, with upper halves being repeated for each input terminal and being switched, upon selection, into circuit with a single, common, unidirectional current path. More specifically, FIG. 4 depicts a two-by-two matrix for purposes of explanation. The terminal 10A constitutes a Tx1,y1 terminal and connects electrically to the cathode of the diode 13A and the anode of the diode 14A, corresponding to diodes 13 and 14 in FIG. 1, respectively. Switching transistors 27A and 30A have collectors connected directly to the other ends of the diodes 13A and 14A rather than through limiting resistors 31 and 32 shown in FIG. 1. Each of the other terminals 10B through 10C connects to a similar circuit. These circuits constitute first unidirectional current paths for bias current.

The other half of a bilateral current gate 12A is constituted by diodes 20 and 21 in a second unidirectional current path and a bias current supply 70 poled to energize the current path comprising diodes 20 and 21. This supply includes circuitry to limit the bias current. A control circuit 50 in FIG. 4, produces ground assertion, x1, x2, y1, and y2 signals for selection of a particular one of the bilateral current gates 12A through 12D. Assuming the x1 and y1 signals are asserted, the switches 26X1 and 26Y1 conduct. More specifically, the assertion of the x1 signal energizes a light-emitting diode 71 that is energized from a power supply 72. The resulting light impinges a light sensitive transistor 73 and turns that transistor 73 on. Likewise, the assertion of the y1 signal energizes the switch 26Y1 by energizing a light-emitting diode 74 and shifting a transistor 75 into a conducting state. Under these conditions, a bilateral current gate is formed by diodes 13A and 14A in the first path and by diodes 20 and 21 in the second path.

The bias current supply 70 then energizes both the diodes 20 and 21. It also energizes the diodes 13A and 14A through a DC current path including the transistor 73, the transistor 27A, the transistor 30A, and the transistor 75. The signals on the Tx1,y2 terminal 10B are blocked by the fact that the path including the switch 26Y2 is not energized. The bilateral gate 12C does not conduct because the switch 26X2 is not energized. The bilateral current gate 12D is not energized because both switches 26X2 and 26Y2 are not energized.

When bilateral gate 12A is selected, the bias current supply 70 supplies current to the path constituted by diodes 13A and 14A and also to the path constituted by diodes 20 and 21. When terminal TX1,Y1 10A has a positive signal, the current through diode 13A decreases, and the current through diode 14A increases. As the current through diode 13A decreases, the current through diode 20 increases to compensate. Similarly, the current through diode 21 decreases to compensate for the increase of the current through diode 14A. Accordingly, the signal at terminal Ti,j 11 is also positive.

Contrariwise, when TX1,Y1 terminal 10A has a negative signal, the current through diode 13A increases while the current through diode 14A decreases. Accordingly, the current through diode 20 decrease and the current through diode 21 is forced to increase to compensate for the decreased current through diode 14A. The signal at Ti,j terminal 11 is forced to a negative state.

Although these paths introduce crossover distortion, the other advantages of this invention are attained. Specifically, the concentrator circuit at FIG. 4 eliminates electromechanical relays. Isolation is provided by the optoelectrical switches. The various circuit elements can be selected to accept the voltage and current levels normally encountered in many applications such as telephone switching applications and all the elements, except for the switches 26, are adapted for large-scale, integrated circuit manufacture. Moreover, in those applications where distortion is not a problem, the circuitry of FIG. 4 has the advantage of lower cost over that shown in FIG. 3.

Figure 5:
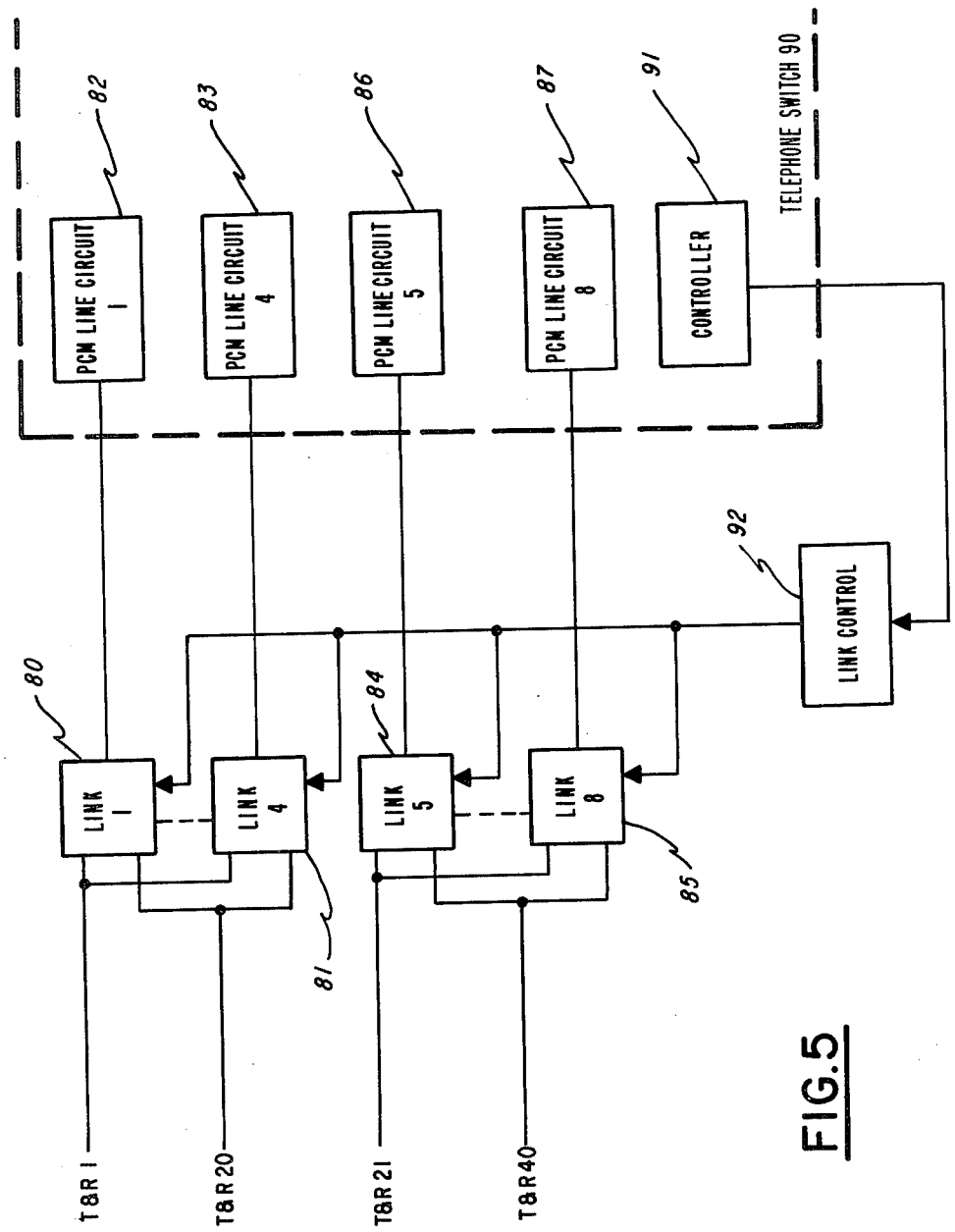
FIG. 5 is a circuit diagram of a portion of a telephone switching circuit that illustrates one application of a concentrator circuit constructed in accordance with this invention.

FIG. 5 depicts an application of the various circuitry that has been described thus far in a telephone switching application. In this particular application, 20 tip and ring conductors, designated as T&R1 through T&R20, connect to four concentrator pairs, or links, with a first link 80 and a second link 81 being depicted. These links comprise 4×5 matrix concentrator pairs according to the construction in either FIGS. 3 or 4. One concentrator connects to the tip conductors; another, to the ring conductors. The output, or common, terminal for each link then connects to a corresponding shared line circuit with a first line circuit being designated by reference numeral 82 and reference numeral 83 designating a fourth line circuit. Likewise, any additional 20 tip and ring signals, represented as conductors T&R21 through T&R40, would connect in parallel to each of four concentrator pairs, or links, with links 5 and 8 designated by reference numerals 84 and 85, respectively. The common terminal of each of these links then connects to fifth through eighth line circuits, fifth and eighth line circuits being designated by reference numerals 86 and 87, respectively. The line circuits, including circuits 82, 83, 86, and 87, are included in the main switching circuitry at a central office designated as the telephone switch 90 in FIG. 5. The telephone switch 90 will include a controller 91 for passing signals to a link control circuit 92 that is analogous to the control circuit 50 in FIGS. 3 and 4. It produces the various matrix selection signals that will select a particular link and particular T&R terminals for coupling through the selected link to the corresponding line circuit. In the specific embodiment shown in FIG. 5, a 5:1 concentration is achieved. Other concentrations also can be achieved by modifying the size of the matrix in any individual link and the numbers of line, or analogous, circuits to which the links attach. For example, a matrix of five by eight in each of LINKS 1–4 would provide a ten to one concentration by interconnecting forty T&R leads and four line circuits.

Thus, there has been described, in accordance with this invention, a switching circuit that is particularly adapted for use as a concentrator of electrical signals. Several embodiments of the switching circuit have been described, but each is characterized by including a bilateral current gate that includes a number of diodes and that acts as a switch in response to a controllably switchable, floating bias circuit which, with selection switching means, enables the bias current to drive the diodes in the bilateral current gate into a forward-conducting mode over a range of input signals to be transferred. Thus, while this invention has been described in terms of specific circuits, it will be apparent that various modifications can be made while still utilizing the basic concepts of this invention and attaining some or all of the advantages of this invention. Therefore, it is the intent of the appended claims to cover all such modifications as come within the true spirit and scope of this invention.

What is claimed as new and desired to be secured by Letters Patent of the United States is:

1. A concentrator circuit for selectively conveying signals between a plurality of first terminals and a second terminal, said concentrator circuit comprising:

A. a plurality of bilateral current gate means for selectively coupling signals between the first terminals and the second terminal, each bilateral current gate means including a plurality of diodes connected to define input and output junctions and first and second balance point junctions, a first terminal being connected to each first balance point junction, and the second terminal being connected to all of said second balance point junctions, each of said input and output junctions of each bilateral current gate means being connected to a normally-open switch means;

B. floating bias means for producing a bias current; and

C. selection means connected to said floating bias means and all of said switch means for selectively closing a pair of said switch means to enable bias current from said floating bias means to flow through one of said bilateral current gate means, thereby enabling a signal input on the first terminal associated with said bilateral current gate means to be coupled to the second terminal.

2. A concentrator circuit as defined in claim 1 wherein said switch means in each bilateral current gate means constitutes transistors of opposite conductivity types, the selection means selectively transmitting an enabling signal that simultaneously enables the base of one transistor and the emitter of the other transistor in the pair, the selection means selectively transmitting a pair of such signals to close a pair of said switch means to allow bias current to flow through said bilateral current gate means.

3. A concentrator circuit as defined in claim 2 wherein said selection means comprises a plurality of selection signal transmitting means and an energizable optoelectronic means connected to each of said selection signal transmitting means for transmitting said enabling signal, each said optoelectronic means comprising light emitting means energizable by a signal from said selection signal transmitting means and means energizable by light from said light emitting means for transmitting the enabling signal in response to the receipt of light from the associated light emitting means.

4. A concentrator circuit for selectively conveying signals between a plurality of first terminals and a second terminal, said concentrator circuit comprising:

A. a plurality of first terminal current gate means each selectively coupling signals from a first terminal, each first terminal current gate means including a plurality of diodes connected to define input and output junctions and a balance point junction, a first terminal being connected to each balance point junction, each of said input and output junctions of each first terminal current gate means being connected to a normally-open switch means;

B. a second terminal current gate means including a plurality of diodes connected to define input and output junctions connected to all of said switch means and a balance point junction connected to the second terminal;

C. floating bias means connected to the input and output junctions of the second terminal current gate means for producing a bias current; and D. selection means connected to said floating bias means and all of said switch means for selectively closing a pair of said switch means to enable bias current from said floating bias means to flow through one of said first terminal current gate means, thereby enabling a signal input on the first terminal associated with said first terminal current gate means to be coupled to the second terminal.

5. A concentrator circuit as defined in claim 4 wherein said switch means in each first terminal current gate means constitutes transistors of opposite conductivity types, the selection means selectively transmitting an enabling signal that simultaneously enables the base of one transistor and the emitter of the other transistor in the pair, the selection means selectively transmitting a pair of such signals to close a pair of said switch means.

6. A concentrator circuit as defined in claim 5 wherein said selection means comprises a plurality of selection signal transmitting means and an energizable optoelectronic means connected to each of said selection signal transmitting means for transmitting said enabling signal, each said optoelectronic means comprising light emitting means energizable by a signal from said selection signal transmitting means and means energizable by light from said light emitting means for transmitting the enabling signal in response to the receipt of light from the associated light emitting means.

* * * * *